(12) United States Patent
Otto, IV et al.

(10) Patent No.: US 12,261,054 B2
(45) Date of Patent: Mar. 25, 2025

(54) SUBSTRATE PROCESSING WITH MATERIAL MODIFICATION AND REMOVAL

(71) Applicant: TOKYO ELECTRON LIMITED, Tokyo (JP)

(72) Inventors: Ivo Otto, IV, Albany, NY (US); Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 192 days.

(21) Appl. No.: 17/886,289

(22) Filed: Aug. 11, 2022

(65) Prior Publication Data

US 2024/0055270 A1 Feb. 15, 2024

(51) Int. Cl.
| | | |
|---|---|---|
| *H01L 21/311* | (2006.01) | |
| *H01J 37/32* | (2006.01) | |
| *H01L 21/02* | (2006.01) | |

(52) U.S. Cl.
CPC .. *H01L 21/31116* (2013.01); *H01J 37/32422* (2013.01); *H01L 21/0234* (2013.01)

(58) Field of Classification Search
CPC ........... H01L 21/31116; H01L 21/0234; H01L 29/775; H01L 21/3115; H01L 29/78696; H01J 37/32422
USPC .................................................. 438/714–724
See application file for complete search history.

(56) References Cited

U.S. PATENT DOCUMENTS

| | | | |
|---|---|---|---|
| 5,888,309 A * | 3/1999 | Yu ..................... | H01L 21/31116 257/E21.252 |
| 6,376,383 B2 | 4/2002 | Mitsuiki | |
| 9,793,135 B1 | 10/2017 | Zaitsu et al. | |
| 10,720,334 B2 | 7/2020 | Vervuurt et al. | |
| 11,557,486 B2 | 1/2023 | Shimizu | |
| 2005/0106888 A1 | 5/2005 | Chiu | |
| 2008/0132074 A1 | 6/2008 | Kim | |
| 2010/0093179 A1 | 4/2010 | Hori | |
| 2016/0379835 A1 | 12/2016 | Kal et al. | |
| 2019/0080925 A1 | 3/2019 | Sherpa et al. | |
| 2020/0043734 A1 | 2/2020 | Pandit et al. | |
| 2020/0286743 A1 | 9/2020 | Lai et al. | |
| 2021/0118667 A1 | 4/2021 | Fukazawa et al. | |
| 2021/0358761 A1 * | 11/2021 | Takahashi ........... | H01J 37/3244 |
| 2022/0238309 A1 | 7/2022 | Luan et al. | |
| 2023/0207653 A1 * | 6/2023 | Tseng .................. | H01L 29/785 |

FOREIGN PATENT DOCUMENTS

| | | |
|---|---|---|
| JP | H06236864 A | 8/1994 |
| JP | H10256232 A | 9/1998 |
| JP | 2001176855 A | 6/2001 |
| JP | 2005039185 A | 2/2005 |

(Continued)

OTHER PUBLICATIONS

PCT International Search Report and Written Opinion, International Application No. PCT/US2023/027170, dated Jul. 7, 2023, 9 pages.

*Primary Examiner* — Duy Vu N Deo

(74) *Attorney, Agent, or Firm* — Slater Matsil, LLP

(57) ABSTRACT

An etch and surface modification is performed in a plasma, in which ions have been removed so that radicals of the plasma form a modified surface of a layer of substrate. A gas chemistry is reacted with the modified surface to form a reacted modified surface, and the reacted modified surface is removed.

21 Claims, 5 Drawing Sheets

(56) References Cited

FOREIGN PATENT DOCUMENTS

| JP | 2007266609 A | 10/2007 |
|----|--------------|---------|
| JP | 2015523734 A | 8/2015  |
| JP | 2018093189 A | 6/2018  |

* cited by examiner

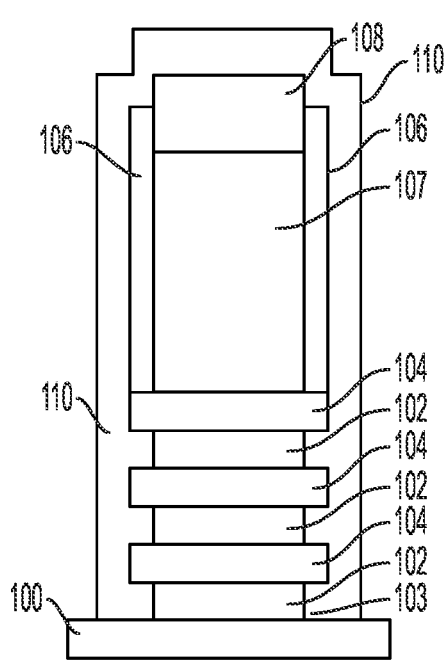
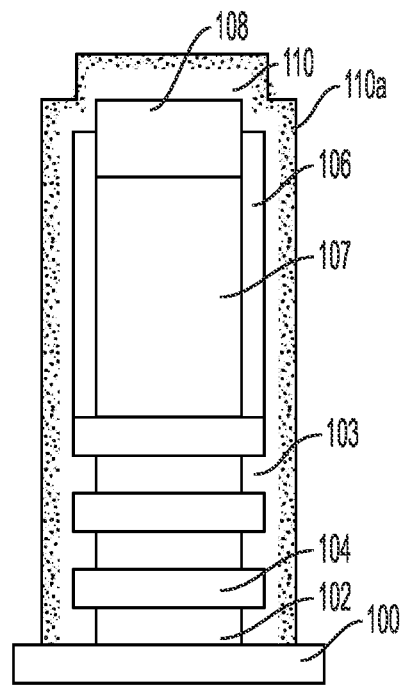
FIG. 1A  FIG. 1B
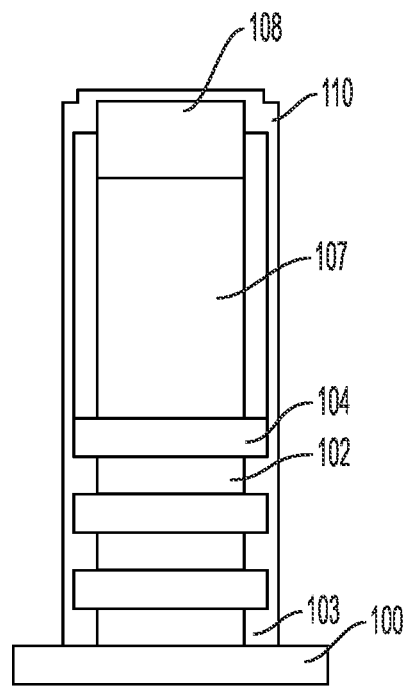
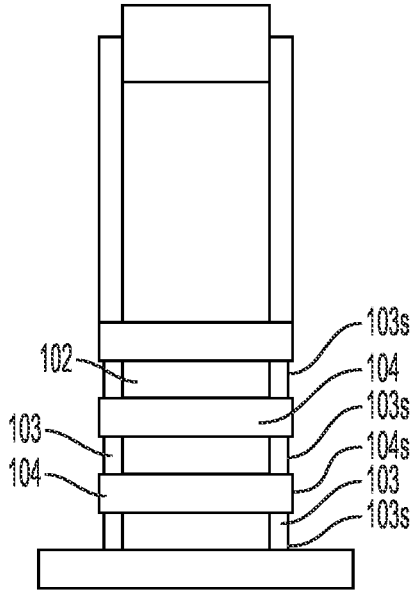
FIG. 1C  FIG. 1D

SUBSTRATE PROCESSING WITH MATERIAL MODIFICATION AND REMOVAL

FIELD OF THE INVENTION

The invention relates to a substrate processing method and a substrate processing apparatus.

BACKGROUND

Etching of semiconductor materials can be particularly challenging due to the need to selectively etch certain materials relative to other materials, and also the extreme precision required in performing the etch. For example, certain materials required to be etched or trimmed are already extremely thin, for example 5 nm or less, and must be etched in the presence of other materials which are not to be etched. Existing etch methods can also be undesirable in that they can result in damage to one or more of the materials and/or result in undesired material modification or undesired residues after the etch process.

SUMMARY

Examples disclosed herein can provide selective etching of thin material layers, with the etching being selective to other materials and also avoiding damage to the material being etched or other materials.

In one example, a plasma is initially used for an etch and modification step, in which a portion of the material being etched is removed, and a remaining surface after the etch is modified to provide a modified material or modified surface. Thereafter, a post-treatment is performed which removes the modified surface. The etch/modification step and the post-treatment can be performed repeatedly to achieve the desired etch amount, or a single iteration of the steps could be used. In an example, the post-treatment includes reacting the modified surface to form a reacted modified surface, and thereafter, raising the temperature to remove the reacted modified surface.

BRIEF DESCRIPTION OF THE DRAWINGS

A better appreciation of examples according to processes and apparatus herein will be better understood in conjunction with the drawings in which:

FIGS. 1A-1D illustrate an example of an etch process;

DETAILED DESCRIPTION

Figure 2:
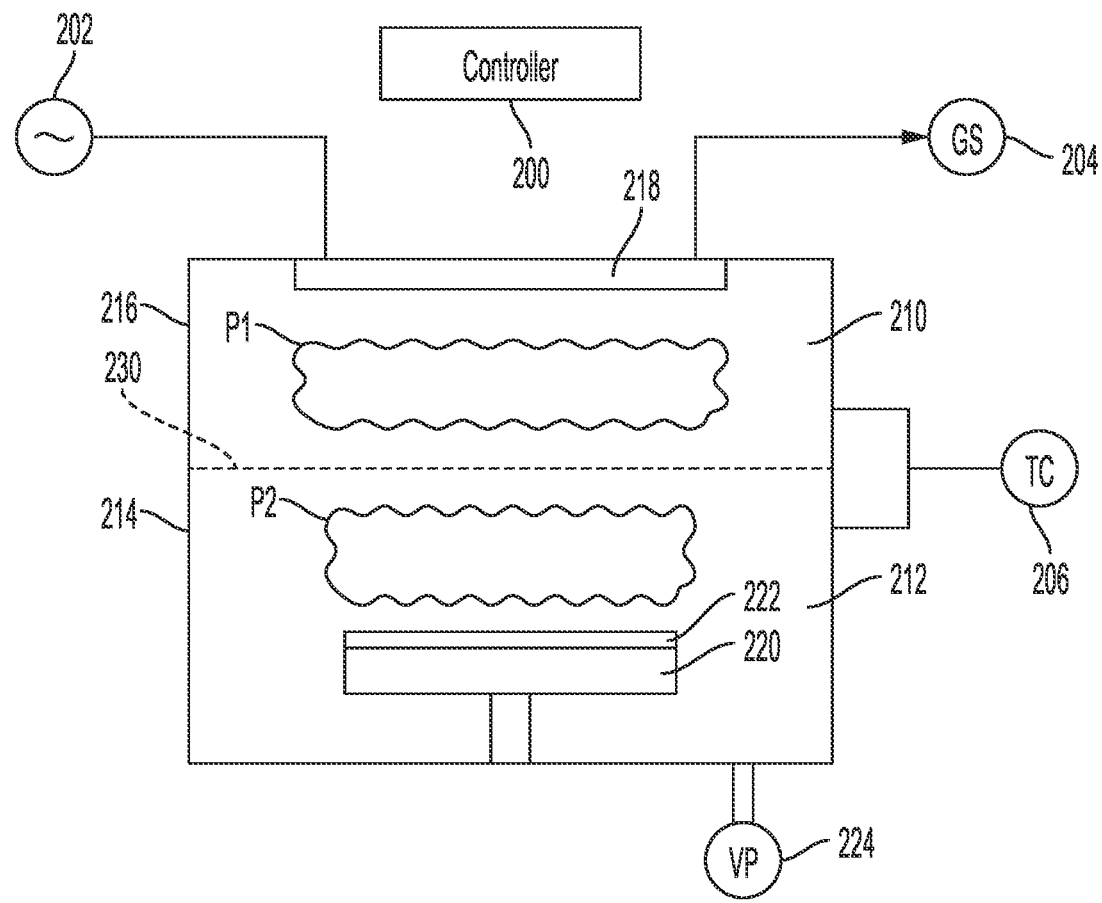
FIG. 2 illustrates an example of an apparatus which can be used for the present processing.

Examples and advantages achieved according to the processes and apparatus herein with become apparent from the detailed description herein with reference to the drawings. It is to be understood that, in practicing the invention, a given process or apparatus might utilize certain aspects of examples herein but not others. Similarly, although advantages are described herein, in practicing a given example, a given example might achieve different or additional advantages, or a subset of advantages described herein. Accordingly, the invention can be practiced with variations and/or subsets of features of the examples disclosed herein.

FIGS. 1A-D illustrate an example of a device to which the present methods and apparatus can be applied, by way of example and not to be construed as limiting.

In the example of FIGS. 1A-D, a substrate, such as a semiconductor substrate, is provided which includes a base 100. The base represented at 100 can include, for example, the base of a semiconductor wafer, and additional layers can also be present on the base 100 and below the features discussed herein to which the present method and apparatus can be applied.

In the illustrated example, the structure includes alternating layers 102, 104. Examples of materials and the architecture of this example are provided for completeness, however, it is to be understood that the methods herein could be utilized for other materials or features/architecture. For example, the layer 102 can include Si, Ge or SiGe. The layer 104 can include Si, Ge or SiGe, but will be different from the layer 102. For example, the layer 102 could be a Si layer containing no Ge or containing Ge in an amount lower than that of the layer 104. The layer 104 can include Ge with no Si, or could include SiGe with Ge in an amount greater than the layer 102, for example.

Further, the positions of the layers 102, 104 could be the reverse of that illustrated. For example, although layer 102 is indented with respect to layer 104, alternately, layer 104 could be indented relative to layer 102. In addition, a given substrate can have different features or devices in different regions of the substrate. For example, a substrate could have a first region in which channels are formed of a higher Ge content layer (with a lower Ge content, or no Ge content, layer between the channels which is indented for spacers and later removed) and a second region in which the channels are formed of a higher Si content (with a higher Ge content layer between the channels which is indented for spacers and later removed). It is also to be understood that, although two alternating layers 102, 104 are provided, it would also be possible to include more than two different layers of materials. In the example of FIG. 1A, one of the layers 102, has already been etched relative to layer 104, so that the layer 102 is indented relative to the layer 104. By way of example, the layer 104 can provide a channel structure, and the layer 102 can later be removed to provide a channel release (removal of the material between channels).

Elements 106 represent gate spacers and can be formed, for example, of SiN or a low-k material. Element 108 can be a mask, such as a hard mask, and can be formed, for example, of $SiO_2$ or SiN. Regarding the materials of elements 106 and 108, although they can have an overlap in the family of materials or set of materials which could be utilized, the materials 106, 108 in a given example will be different from each other.

An inner spacer is illustrated at 110. A spacer material of inner spacer 110 is formed as a layer over the features or other layers, and fills the indented portions 103 of the layer 102, in a region between the layers 104. For example, the spacer material of layer can include SiN or a low-k dielectric material. Low-k dielectrics of the spacer layer will include one or more of Si, N, C, O and/or H. For example and not to be construed as limiting, the dielectric can be SiCN. The dielectric can also be doped, for example, with boron to provide a SiBCN dielectric. In a preferred example, the layer 110 will not include a metal and materials used in the modification and etching will not add a metal to the layer 100. In addition, it is preferred that layers directly under layer 110 and in contact with layer 110 (or that are exposed during processing, e.g., layer 600 discussed in connection with FIGS. 5A-B) will have at least one of a lower oxygen content or a higher carbon content compared to the modified surface 110a of the layer being etched.

The spacer material of inner spacer 110 will be a different material than that of the gate spacers 106 and mask 108. In the region 107, a dummy gate is provided, for example, formed of amorphous silicon (a-Si). The region 107 provides a region in which a gate metal is later deposited. Similarly, a gate metal can be deposited in the regions occupied by layers 102, after a channel release (removal of layers 102) and deposition of a gate metal in these regions in the illustrated example.

The spacer layer 110 will often be extremely thin or small, for example, having a thickness of 5 nm prior to processing described herein, and becomes smaller or thinner with processing.

In the example of FIGS. 1A-D, the objective is to remove portions of the spacer material to leave a spacer as indicated at 103 (FIG. 1D) in the region of the layer 102 which has been indented and adjacent to the layer 104 or between layers 104. Preferably, the outer surface 103s of the spacer 103 does not extend beyond the outer dimension of the surface 104s of the layer 104. More preferably, as shown in FIG. 1D, it is preferred that the outer surface 103s will be slightly recessed from the surface 104s of the adjacent layer 104, so that an outer dimension of the spacer 104 is smaller or recessed from the outer dimension of the layer 104 at surface 104s. In fact, the recess of surface 103s with respect to surface 104s can be a requirement for subsequent processing and development of the device. Although the indentations are shown on opposite sides (left and right in FIG. 1D), it is also to be understood that the device can have additional indentations, for example, on four sides (in front of and behind the figures shown) considering the device three-dimensionally. Given the initial thickness of the inner spacer layer 110 of FIG. 1A is already small (for example 5 nm or less), the etching must therefore be very precise. In addition, the etching or removal of layer 110 should be selective with respect to layers under layer 110, so that the under layers are not damaged by the partial removal of layer 110 to leave spacers 103. Portions of the other layers can be exposed during the completion of the etch of layer 110 to leave spacers 103.

In processing the substrate to progress from FIG. 1A to FIG. 1D, an etch and modification step is performed as illustrated in FIG. 1B. In the etch modification step, the spacer material of the inner spacer layer 110 is etched and modified in one step, so that a portion of the layer 110 is removed and a remaining surface or modified surface 110a of the material 110 is modified compared to the material prior to the etch/modification step. Thus, after the etch and modification step, some of the material 110 has been removed, and a modified surface 110a remains, with the modified surface 110a having an increased amount of oxygen and an increased amount of fluorine compared to the material of the inner spacer layer 110 prior to the etch and modification step.

The etch and modification step can include a plasma process in which ions of the plasma have been removed, so that the etching and modification is performed with radicals of the plasma. The plasma gases will include at least fluorine and oxygen, preferably also hydrogen, and can also include carrier gases, typically inert gases. Examples of gases used in forming the plasma include $NF_3$, $H_2$, $O_2$, Ar, NO and $N_2$, and the gases will include at least one fluorine containing gas and at least one oxygen containing gas. In a preferred example, a remote plasma is first formed of the plasma gases, and ions are removed from the plasma, for example, as the plasma moves from a chamber (or chamber portion) in which the plasma is generated to a chamber or chamber portion in which the substrate is present. The plasma etch and modification can occur, for example, at a temperature of −20° C. to 100° C., and preferably from 0° C. to 85° C., more preferably 15° C. to 85° C. A preferred temperature range can also be from 0° C. to 50° C. for more control (smaller etch steps). For more aggressive etch modification, the etching and modification can occur at temperatures in a range of 50° C. to 100° C., and preferably from 50° C. to 85° C. For a less aggressive etch and modification, lower temperatures are preferred, in a range of 0° C. to 50° C. In a preferred example for better control, the depth of the etch modification and the thickness subsequently removed is 1 nm or less for each iteration (etch modification and subsequent post-treatment discussed later). The pressure can range from 10 mTorr to 1000 mTorr, for example and preferably 25 mTorr to 500 mTorr. In a more aggressive etch modification, performed at a higher temperature and higher concentrations of oxygen and/or fluorine, the thickness of the modified surface will be larger, and the final structure of FIG. 1D can be performed with one occurrence of the etch and modification step and one occurrence of the post-treatment step (discussed later). For better control, thinner modified surfaces can be formed at lower temperatures, and the etch modification step can be followed by the post-treatment step, followed by one or more additional repetitions of the etch modification step and the post-treatment step(s). Lower pressures can extend the time for the etch modification to also provide better control of the extent or thickness of the modified surface. As a further modification, where repeated cycles are utilized, one or more early cycles could utilize a higher temperature (e.g., 50° C. or higher such as 50° C. to 85° C.), while one or more other cycles could utilize an etch modification at a lower temperature (for example, 50° C. or lower such as 0° C. to 50° C.). Preferably, where controlled removal is desired, each iteration of the etch modification and post-treatment (reaction of the modified surface followed by heat treatment) will remove less than 1 nm of the target material being etched. During the etch and modification step, a portion of the layer 110 is removed and a remaining surface 110a is modified to have an increased amount of oxygen and fluorine. It is also within the scope of examples herein to provide a modified surface 110a having an increased oxygen and fluorine content without removal of material of the layer 110 during the modification. In most examples, a portion of layer 110 will also be removed in the etch and modification process or process step.

In an example, in forming the plasma, a volumetric flow rate of the fluorine containing gas can be, for example, 5% to 25% of the total gas flow, with the fluorine containing gas being $NF_3$, for example. The oxygen can be, for example, 20% to 55% of the total volumetric flow, and the hydrogen can be, for example, less than 25%, for example, 5% to 25%. The remainder of the gases in an example will be nitrogen and argon. For more aggressive etch and modification steps the volumetric flow rate of $NF_3$ can be 20% to 25%, with the volumetric flow rate of oxygen 45% to 55%. However, as discussed later, if other materials are exposed during processing (other than the material being removed), additional modifications may be used, for example, maintaining oxygen to 1% to 5% where an OPL (organic planarization layer) is present.

After the etch and modification step, the post-treatment is performed. In an example, the post-treatment includes two steps, or sub-steps, including a gas chemistry treatment or reaction, in which the modified surface 110a is reacted with gas chemistry gases, preferably not in a plasma state, so that a reacted modified surface is formed from the modified surface 110a. The substrate is then subjected to a heat treatment in which the temperature of the substrate is increased to remove the reacted modified surface. As can be seen in FIG. 1C, after the post-treatment, the modified surface 110a has been removed, and the amount of material of the layer 110 is reduced as shown in FIG. 1C compared to FIG. 1B and compared to FIG. 1A. In the illustrated arrangement, additional removal of the layer 110 is needed (one or more additional repetitions of the etch and modification followed by the post-treatment) to achieve the final desired results shown in FIG. 1D. However, as noted earlier, one occurrence each of the etch and modification step and the post-treatment could be utilized to achieve the final architecture of FIG. 1D, particularly if a more aggressive etch and modification step is utilized at higher temperatures (and/or higher fluorine and/or oxygen amounts).

The reacting of the modified surface is with a gas chemistry different from that in forming the plasma for the etch modification, and can be with a gas which includes HF and $NH_3$, and can also include Ar and $N_2$. The temperature can be, for example, 15° C. to 120° C., however, lower temperatures are preferred, because the gases that will react with the modified surface will more likely stick or bond to the modified surface at lower temperatures. For example, the temperature can be in a range of 15° C. to 85° C., preferably less than 50° C., for example 30° C. to 50° C. Pressures can be 10 mTorr to 3000 mTorr, for example 25-2000 mTorr.

After reacting of the modified surface to form a reacted modified surface, the temperature of the substrate or substrate environment is raised for a heat treatment step (higher than the temperature during reacting), for example to 70° C. to 300° C., preferably 100° C. to 250° C., for example 150° C. to 250° C. Where an OPL is present (e.g., as in FIGS. 5A-B, discussed later), lower temperatures are preferred, such as 70° C. to 150° C. Preferably, the heat treatment is in an inert environment, e.g., including N and Ar, and preferably no halogen, no oxygen or other reactive gases are present. Thus, although HF and $NH_3$ are introduced during reacting of the modified surface in the initial post-treatment, they are not introduced into the environment in which the substrate is present during the heat treatment. The pressure can be 1000 mTorr to 10,000 mTorr, preferably 1000 mTorr to 5000 mTorr, for example 1000 mTorr to 3000 mTorr (e.g., 2000 mTorr), and will typically be a higher pressure than the modification and the reacting of the modification. The heat treatment is preferably at least 60 seconds, more preferably greater than 120 seconds. The heat treatment can be in the same chamber as the reacting of the modified surface, or alternately, the substrate can be transferred to another chamber for the heat treatment.

Referring to FIG. 2, an example of an apparatus which can be utilized to perform the etch modification is illustrated. The apparatus is controlled by a controller 200 which controls the apparatus to perform the processes disclosed herein, including control of the power from a power source 202, the supply of gases from a gas supply source GS 204, and the control of temperature by a temperature control system TC 206 which can include one or more heaters. The heaters can be provided in the first chamber (or chamber portion) 210, and optionally could also be provided in the second chamber (or chamber portion) 212 in which the substrate is processed. The heaters can include heaters associated with one or more of the chamber walls 214, 216, and/or with an electrode 218 associated with the chamber or chamber portion 210, and/or heating can also be provided in connection with the substrate holder or substrate support 220, on which the substrate 222 being processed is positioned. The substrate support 220 or other components could also have the components for cooling if desired, e.g., with liquid or gas cooling or heat exchange devices. Plasma process gases are evacuated with a vacuum pump VP indicated at 224. The combination of the gas flow into the system and the evacuation of gases by the vacuum pump can also be used to control the pressure within the apparatus.

The controller 200 can include, for example, one or more processors or computers, and can also include a memory to store e.g., process commands, recipes, recipe data, substrate data or other control data. The control information can also be supplied to the controller 200 from another device or a memory separate from the controller 200. The control and recipe data are preferably stored in a non-transitory computer readable medium. It is also to be understood that, while one controller is identified or represented at 200, the controller can include one or more sub-controllers or separate controllers which operate independently or under commands from the controller 200 to control the various power, gas supply and temperature control equipment and functions to perform processes as described herein.

The gas supply 204 includes a source of at least one oxygen containing gas and at least one fluorine containing gas, preferably also hydrogen. The gas supply 204 controllably supplies process gases in amounts of concentration instructed. Typically a carrier gas is also provided, such as argon. By way of example, the gas source 204 provides a supply of one or more gases selected from $NF_3$, $H_2$, $O_2$, Ar, NO or $N_2$, with the supplied gases including at least fluorine and oxygen. Although preferred gases and materials are described herein, it is to be understood that other combinations would also be possible. In addition, as used herein, reference to a gas or element not being used or not being present means the gas or element is not intentionally added or introduced, although trace amounts of materials might be present depending upon the purity of materials used.

Although an electrode is illustrated schematically at 218, other types of plasma generation could be utilized, for example, one or multiple electrode arrangements with one or plural radio frequencies, or with an inductive element at a top or outside of the chamber to provide an inductive power or, for example, microwave components to generate plasma with microwave energy. In an example, power is provided in a range of 300-1000 watts to generate the plasma. The gas from the gas source 204 could be supplied through the electrode 218 (e.g., in a showerhead arrangement), and/or through other gas inlets, and the gases can be mixed upstream from the chamber or inside of the chamber 210.

A first plasma schematically represented at P1 is thus formed in the chamber or chamber portion 210. In addition, in the illustrated example, a separator such as a mesh or grid provides a filter or separator 230 which is powered to filter or remove ions (preventing ions from passing therethrough) so that plasma passing from the chamber 210 to the chamber (or chamber portion) 212 passes without ions passing through the separator or filter 230. As a result, a second plasma schematically represented at P2 will have no ions (or at least fewer ions compared to the plasma P1). In a preferred form, the plasma P2 will have no ions, but will include radicals of at least oxygen and fluorine which will react to etch the surface and form a modified surface on the layer of the substrate being etched and modified. The arrangement of FIG. 2 can be considered as including separate chambers, or as one chamber including separate chamber portions. In addition, it is to be understood that the plasmas P1 and P2 are represented schematically, because they differ from each other in that the second plasma has had the ions removed. However, rather than appearing as separate distinct plasmas P1 and P2, the first and second plasmas P1 and P2 can appear as continuous extending from the first chamber portion to the second chamber portion, however, the second plasma in the second chamber portion to which the substrate is subjected will be a different plasma or second plasma in that the ions have been removed.

The pressure and temperature will be controlled within the ranges as discussed earlier.

Figure 3:
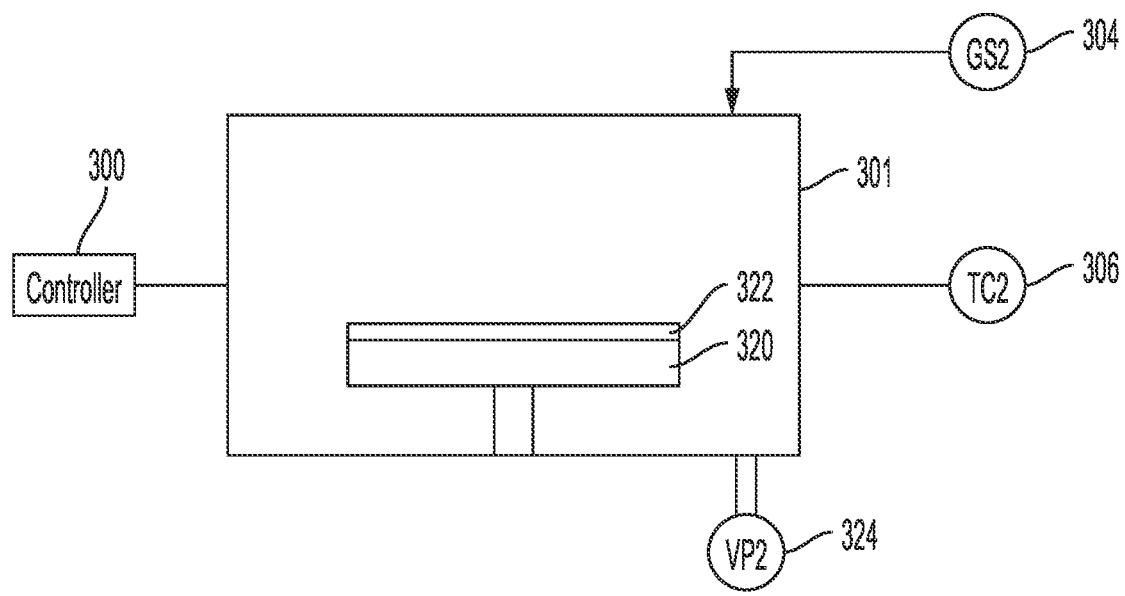
FIG. 3 illustrates an example of an apparatus which can be used for post-treatment processing.

After the etch/modification with radicals, a post-treatment is performed. Although it is possible to perform the processing steps in one chamber, in a presently preferred example, the treatment after the etch/modification is performed in a separate chamber 301 illustrated in FIG. 3. The chamber 301 is controlled by a controller 300, which can include one or more processors or computers configured to control the operation and processes performed in the chamber 301. As noted with respect to controller 200, the controller 300 can store instructions or process commands (e.g., with a memory including a non-transitory computer readable medium), or can receive instructions or data from a separate memory or controller. As also discussed earlier, controller 300 can be a single controller or can include distributed controllers or sub-controllers to control the various components and operations discussed herein.

A gas supply GS2 shown at 304 controllably supplies process gases from one or more gas sources (which are part of the gas supply GS2) in instructed concentrations, and the temperature can be controlled by various temperature control expedients as represented at TC2 306, which can include temperature control of the substrate holder 320 and/or of the chamber walls and/or radiant or other forms of temperature control. The substrate 322 is positioned on the substrate holder 320 and can be held, for example, by electrostatic attraction with an electrostatic chuck. A vacuum pump VP2 at 324 is provided to exhaust gases. In a presently preferred example, gases from the gas supply 304 are not excited into a plasma, but rather are provided in a gaseous phase so that the treatment is performed by a gas phase chemistry.

The gas phase chemistry will include gases that will react with the modified surface to form a reacted modified surface that can be removed in a heat treatment. The heat treatment can be in the same chamber as the gas phase reaction, or could be performed in a separate chamber after the gas phase (non-plasma) reaction. The gas phase reaction of the modified surface can be, for example, with gases including HF, $NH_3$, $N_2$ and Ar, and can be performed, for example at a pressure in a range from 25 mTorr or 2000 mTorr and a temperature in a range from 15° C. to 200° C., preferably below 100° C. and within temperature ranges discussed earlier herein. The subsequent heat treatment or sublimation can be performed at a pressure in a range, e.g., from 1000 mTorr to 2000 mTorr and a temperature of 70° C. to 200° C., with $N_2$ and Ar supplied to the chamber, and preferably without an etchant gas (e.g., without a halogen gas introduced during the heat treatment). The heat treatment is in a non-plasma environment, without introducing the HF and $NH_3$ that were introduced during reacting of the modified surface.

Figure 4:
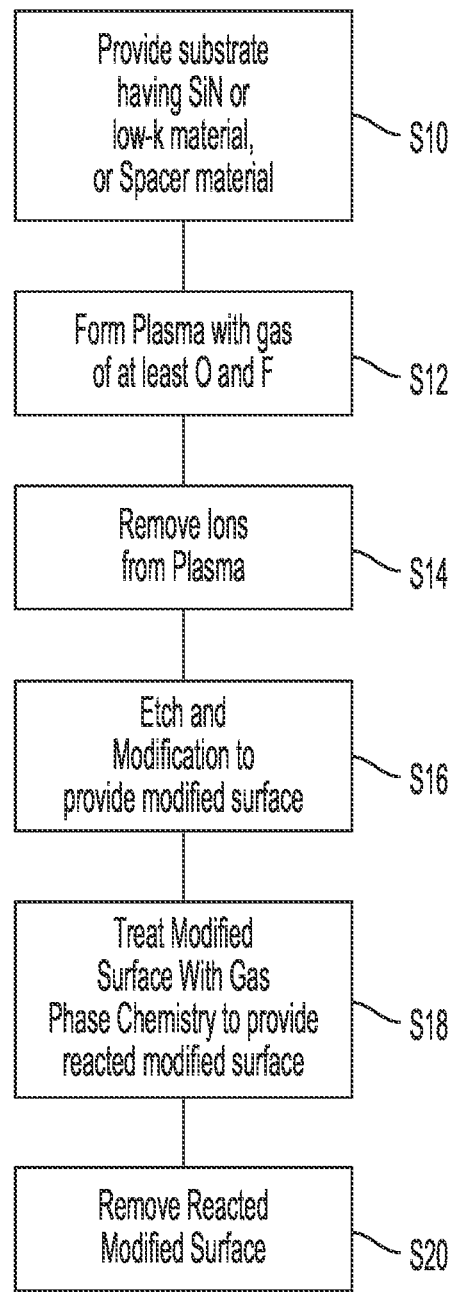
FIG. 4 is a flowchart of an example of a process or control algorithm.

FIG. 4 is a flowchart or algorithm according to an example of a process disclosed herein, and which can be utilized or implemented by one or more of the controllers previously discussed. As indicated, in step S10, a substrate is provided which can include a SiN layer or a low-k dielectric material, e.g., for the layer 110. In step, S12, a plasma is formed which includes at least O and F, and ions are removed from the plasma as indicated at S14. At S16, an etch and modification is performed with radicals of the plasma to provide a modified surface of the SiN or low-k material. Typically, this step will remove a portion of the material and the remaining surface will be modified to include an increased amount of oxygen and fluorine. It would be possible, however, to perform this step as a modification step without necessarily removing the material. Step S16 is performed with the plasma that had the ions removed, so that radicals of the plasma perform the modification and etch.

At step S18, the modified surface is then treated or reacted with a gas phase chemistry (in a non-plasma or without a plasma), to form a reacted modified surface. This can be, for example, with a gas chemistry of HF, $NH_3$, $N_2$ and Ar. The reacted modified surface is then removed as indicated at S20 with a heat treatment, e.g., in an environment of Ar and $N_2$, without a plasma.

Figure 5A:
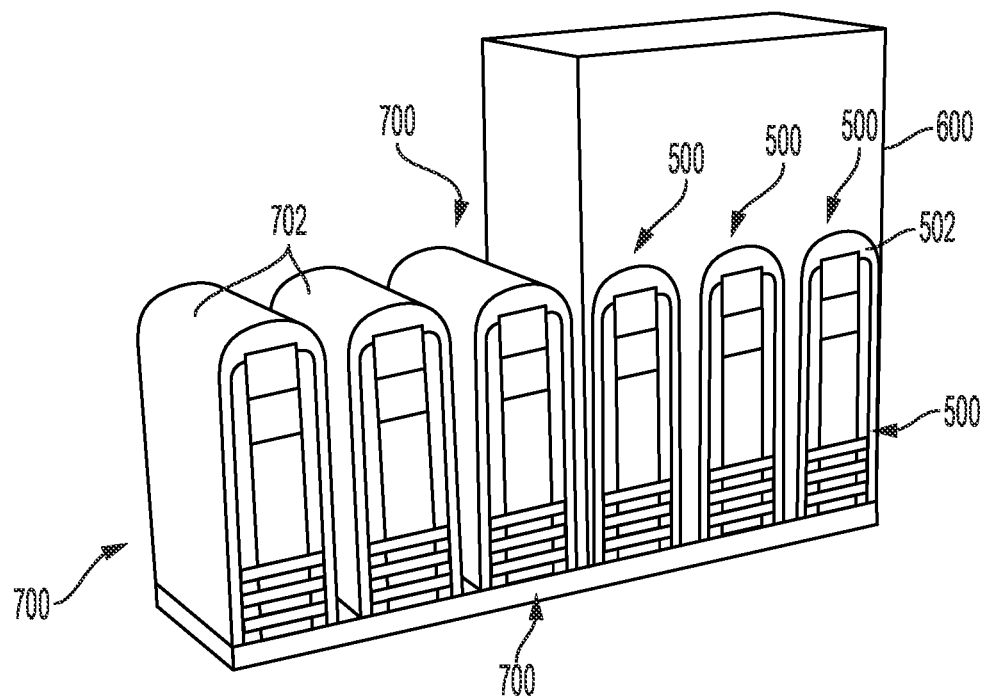
FIGS. 5A and 5B illustrate processing with selected covering of portions of the substrate.
Figure 5B:
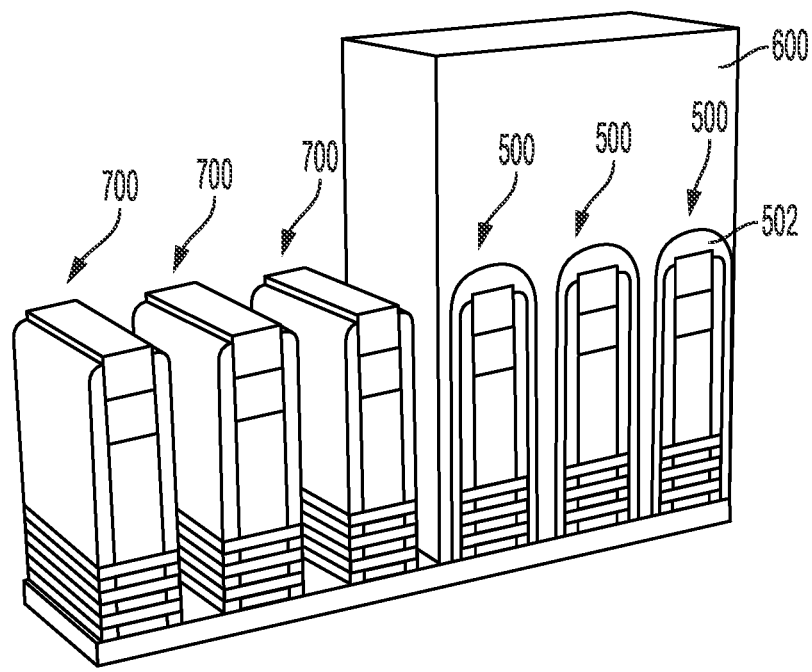

FIGS. 5A and 5B illustrate another application or example to which processes disclosed herein can be utilized. In certain manufacturing processes or process flows, it is important to selectively cover certain features while other features are processed. For example, as shown in FIG. 5A, certain features, for example gate architecture features or devices, represented generally at 500, are covered with a film, for example, an organic film 600 such as an OPL, while other features indicated generally at 700 are not covered by the organic film 600, so that the features 700 can be further processed separate from the features 500. The features 500 will be covered by a liner 502, and the features 700 will also be covered by a liner 702, to protect the features during deposition of the film 600 or other processing. Thus, the substrate can include a first set of features or devices in a first region, and a different second set of features or devices in a second region. In the example of FIGS. 5A and 5B, the present process can be utilized for removal of the liner 702 for processing features or devices 700 separate from the features 500. The liners 702 can be, for example, a SiN or low-K material (e.g., including one or more of Si, N, C, O or H, e.g., SiOCN), and the liner can be removed according to processes as disclosed herein. In the removal of the liners 702, the same general processing disclosed herein is utilized, however preferably a lower oxygen content is used for the etch and modification step (steps S12-S16 discussed earlier), for example, with oxygen in a range 1-5% of the volumetric flow rate to avoid damage to the organic or OPL 600. The fluorine containing gas for the etch modification can be as disclosed according to the ranges of 5%-25% disclosed earlier herein, and preferably toward the higher portions of those ranges (e.g., 15-25% or 20-25% $NF_3$). In addition, the etch and modification step is preferably performed at lower temperatures such as below 100° C., preferably less than 50° C., for example 35° C. to 50° C. After the etch and modification, the liners 702 are reacted in a gas chemistry phase step (without plasma) to form a reacted modified surface followed by an increase in temperature to remove the liners 702 to provide exposed features or devices, as illustrated in FIG. 5B, which then can be processed, separate from the features or devices covered by the organic film or layer 600. The heat treatment temperature can be, e.g., in a range of 100° C. to 250° C. Lower temperatures can be desired to avoid damage to or degradation of organic materials or OPL (e.g., 70° C. to 150° C. or 100-150° C.).

Figure 6A:
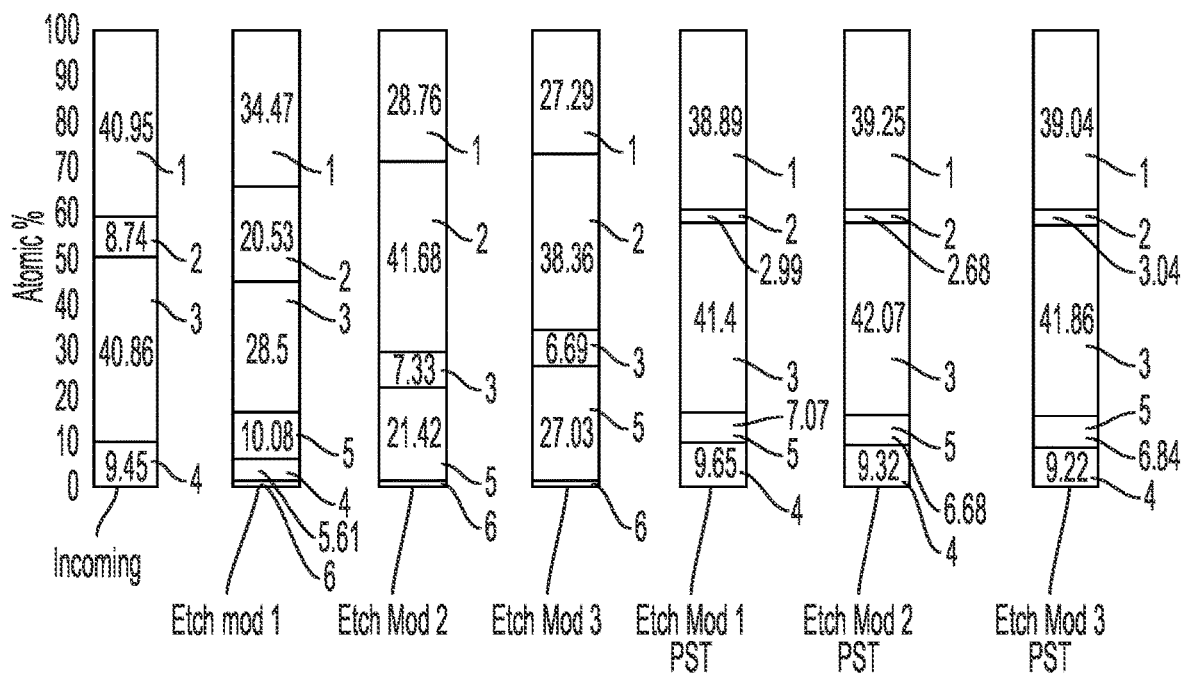
FIGS. 6A and 6B illustrate compositions for materials being etched before processing, after partial processing, and after completion of processing.
Figure 6B:
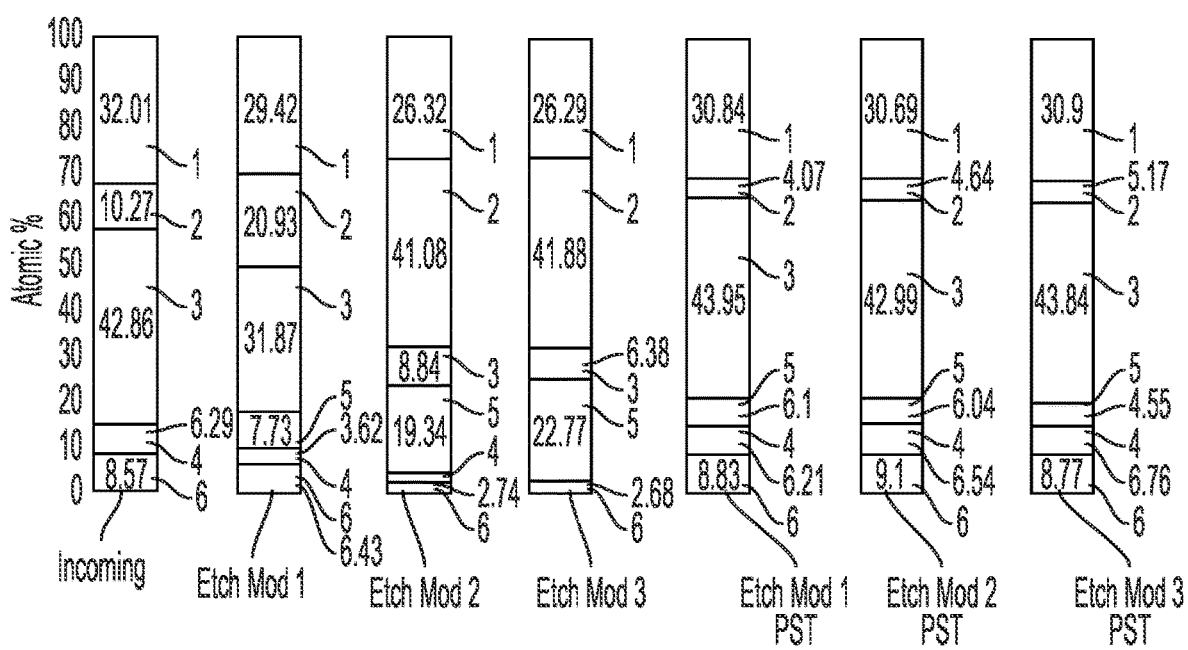

FIGS. 6A and 6B illustrate an advantage of the present process in that the composition of the material after processing is substantially the same compared to prior to processing. In other words, after the etch modification and subsequent post-treatment, the material properties in terms of the composition percentages are substantially the same. Thus, the material can be removed in one or more iterations to leave a desired amount of material or material in a desired location (for example, material that will remain as a spacer in an indent), and despite the processing to remove the material, the remaining material will retain its integrity in terms of the composition of the material being used. FIGS. 6A and 6B also demonstrate the highly controllable nature of the present processing in that significantly different amounts of modification or modification thickness can be obtained (as indicated by the different amounts of oxygen and fluorine for the different etch modifications). Because the amounts of material modified will correspond to the amount of material removed or thickness removed in the post-treatment (PST, including the gas phase reaction and heat treatment), typically with all of the modified surface or modified material removed during the PST, the control of the etch modification makes the overall process highly controllable in terms of the amount of material or material thickness removed in a given iteration of the process steps. Thus, an extremely fine etch (e.g., to have a spacer surface 103s slightly recessed with respect to an adjacent layer surface 104s) can be more readily achieved. Moreover, despite variation in the process for the etch modification, the material being etched returns to be remarkably similar to its incoming state after the PST, for each of the processes compared to each other.

FIG. 6A illustrates advantageous results for a first dielectric material, SiCN, while FIG. 6B demonstrates advantageous results for another low-k material with similar advantageous results, with FIG. 6B corresponding to a material which has been boron doped, to provide SiBCN. Three different etch modification steps were used for each, for different amounts of aggressiveness of the etch and surface modification step. As discussed earlier, a more aggressive etch and modification (each iteration can provide a thicker modified surface, and thus, a greater amount of material can be removed for one iteration (each iteration including the etch modification step and the post-treatment step at which the modified surfaces are reacted to form a reacted modified surface and then removed with a heat treatment). A more aggressive etch modification will include a higher temperature and can include an increase in O and/or F compared to a less aggressive modification. In FIGS. 6A-B, Etch Mod 2 was more aggressive than Etch Mod 1, and Etch Mod 3 more aggressive than Etch Mod 2.

The left bar graph in each figure illustrates the incoming composition, with region 1 representing the silicon content, region 2 representing the oxygen content, region 3 representing the nitrogen content, region 4 representing the carbon content. Region 5 represents the flourine content, and region 6 represents the boron content. In bar graphs where the content did not exist or was negligible, they are not identified numerically. Atomic weight percentages are identified for the remaining materials with atomic weights having two decimal numbers. The graphs also illustrate that the etch and modification step is substantially confined to the region of the modified surface that is removed during the post-treatment steps, and thus, the integrity of the material is maintained.

As illustrated in FIG. 6A, after the etch modification and also the post-treatment, (PST), the amount of Si, N and C are all within less than a of 5% difference compared to the incoming composition. In addition, for the boron doped low-k material (FIG. 6B), the change (for Si, N and C) is also less than 5%. Changes in the atomic weight percentages of Si, N and C can actually be less than a 2%, and in fact less than a 1% change in terms of the atomic percentage of the overall composition for the material after PST compared to the incoming material. However, the amount of O and F varied significantly for the different etch modifications (prior to PST), demonstrating controllability of the process.

The etch modification 1 was performed at 20° C., while etch modification 2 was performed at 50° C., and etch modification 3 was performed at 70° C. As can be seen, the flourine (region 5) and oxygen (region 2) content significantly increased as a result of the etch modification, with the amount of increase varying significantly depending upon the aggressiveness of the treatment, with the increases more significant for the more aggressive etch modification 3 compared to etch modification 2, and with etch modification 2 exhibiting greater increases compared to etch modification 1. Nevertheless, after the etch modification and after performing of the post-treatment, as represented respectively by Etch Mod 1 PST, Etch Mod 2 PST, and Etch Mod 3 PST, despite the differences after the Etch Mod and before the Etch Mod PST, after the post-treatment, the materials returned substantially to their incoming compositions. Thus, FIGS. 6A and 6B demonstrate the ability to vary the amount of modification or thickness of the modification resulting from the etch modification step, providing the ability to vary the amount of material removed for a given iteration of an etch modification and post-treatment PST. However, the integrity of the material is substantially unaffected, because the material composition after the modifications and the post-treatment are remarkably similar to each other and also remarkably similar to the incoming composition.

The disclosed method and apparatus can be utilized in various applications, including but not limited to nfet, pfet, nanosheet, GAA, finfet, CFET, and other devices or device features.

It is to be understood that modifications and variations can be incorporated consistent with the teachings herein. It is therefore to be understood that within the scope of the present claims, the invention can be practiced otherwise or with variations with respect to the examples disclosed herein.

The invention claimed is:

1. A substrate processing method comprising:
   providing a substrate which includes a spacer layer formed of a spacer material;
   performing an etch and surface modification step in which a surface of the spacer material is etched to remove a portion of the spacer material and a remaining surface of the spacer material is modified to provide a modified surface having an increased content of oxygen and fluorine compared to the spacer material before the etch and modification step, the etch and surface modification step including exposing the spacer material to a plasma which includes at least fluorine and oxygen; and
   after the etch and surface modification step, performing a gas chemistry etch which is not in a plasma to remove the modified surface of the spacer material, the gas chemistry etch includes a first step and a second step, the first step using HF and $NH_3$, the second step using Ar and/or N and not using HF or $NH_3$, and the second step being performed at a higher temperature than the first step.

2. The method according to claim 1, wherein the etch and surface modification step comprises:
forming a first plasma;
removing ions from the first plasma to form a second plasma having no ions or less ions than the first plasma; and
exposing the spacer material to the second plasma so that radicals of the second plasma etch the spacer material and modify the remaining surface to provide the modified surface.

3. The method according to claim 2, wherein the gas chemistry etch includes reacting the modified surface with a gas chemistry at 100° C. or less to form a reacted modified surface.

4. The method according to claim 3, wherein the reacting of the modified surface is at a temperature from 0° C. to 85° C. to form the reacted modified surface.

5. The method according to claim 4, further including, after the reacting of the modified surface at 0° C. to 85° C., raising temperature of the substrate to a range of 100° C. to 250° C. to perform a heat treatment to remove the reacted modified surface.

6. The method of claim 1, wherein gases used for the etch and surface modification are different from gases used during the gas chemistry etch to remove the modified surface.

7. The method of claim 2, wherein the spacer material includes one or more of Si, N, C, O or H, and the spacer material does not include a metal,
wherein the second plasma includes radicals of oxygen and radicals of fluorine.

8. The method of claim 7, wherein the substrate includes plural layers adjacent to and covered by the spacer layer prior to the etch and surface modification step, and each of plural layers has at least one of a lower oxygen content or a higher carbon content compared to the modified surface of the spacer layer.

9. The method of claim 8, wherein the plural layers include a stack of alternating first and second layers, each first layer having a higher Ge content compared to each second layer, and each second layer having a higher Si content compared to each first layer,
wherein prior to the etch and surface modification step, one of the first layer and second layer is indented with respect to another of the first and second layers such that an indentation is provided in the one of the first and second layers,
wherein prior to the etch and surface modification step, the spacer material fills the indentation and covers side surfaces of both of the first and second layers, and
after one or more iterations of the etch and surface modification and the gas chemistry etch, the spacer material remains in the indentation to form a spacer with an outer surface dimension of the spacer recessed from an outer surface dimension of said another of the first and second layers, and an outer surface of said another of the first and second layers is exposed.

10. The method of claim 5, wherein:
the substrate includes plural adjacent layers which are adjacent to and covered by the spacer layer prior to the etch and surface modification step, and each of the plural adjacent layers has at least one of a lower oxygen content or a higher carbon content compared to the modified surface,
the plural adjacent layers include a stack of alternating first and second layers, each first layer having a higher Ge content compared to each second layer, and each second layer having a higher Si content compared to each first layer,
prior to the etch and surface modification step, one of the first and second layers is indented with respect to another of the first and second layers such that an indentation is provided in the one of the first and second layers,
prior to the etch and surface modification step, the spacer material fills the indentation and covers side surfaces of both of the first and second layers, and
after one or more iterations of the etch and surface modification step and the gas chemistry etch, the material of the spacer layer remains in the indentation to form a spacer with an outer surface dimension of the spacer recessed from an outer surface dimension of the another of the first and second layers, and an outer surface of said another of the first and second layers is exposed.

11. The method of claim 5, wherein the forming of the first plasma is with volumetric flow rates of 5% to 25% $NF_3$, 25% to 55% oxygen, 25% or less hydrogen, and remaining gases of argon or nitrogen,
the gas chemistry reacting is with HF and $NH_3$, and
the heat treatment is in an environment consisting of argon and/or nitrogen.

12. The method of claim 1, wherein the etch and surface modification is performed by forming a plasma with $NF_3$ and oxygen, removing ions from the plasma, and after removing ions, exposing the spacer material to the plasma.

13. The method of claim 12, wherein the etch and surface modification is performed at a temperature in a range from 15° C. to 85° C.,
the first step is performed at a temperature in a range from 0° C. to 50° C., and
the second step is performed at a temperature in a range from 70° C. to 300° C.

14. A substrate processing method comprising:
providing a substrate having a layer thereon, the layer formed of a material which includes at least one of Si, N, C, O or H;
forming a first plasma which includes at least oxygen and fluorine;
removing ions from the first plasma to form a second plasma which includes radicals of oxygen and radicals of fluorine;
modifying a surface of the layer with the second plasma to form a modified surface, the modified surface having an increase in fluorine and oxygen compared to the material of the layer prior to the modifying;
performing a gas chemistry etch to remove the modified surface, the gas chemistry etch performed in a non-plasma environment, and wherein the gas chemistry etch comprises:
reacting the modified surface with a gas chemistry at a temperature below 100° C. to form a reacted modified surface; and
raising a temperature of the substrate to above 100° C. to perform a heat treatment to remove the reacted modified surface.

15. The method of claim 14, wherein:
a gas composition of an environment in which the substrate is positioned is different for the modifying than in the reacting,
a gas composition for the reacting is different than for the heat treatment,
temperature during the modifying is in a range from 0° C. to 85° C.,
temperature during the reacting is in a range from 0° C. to 85° C., and
temperature during the heat treatment is in a range from 100° C. to 250° C.

16. The method of claim 15, wherein the layer does not include a metal, gases introduced during the forming of the first plasma do not include a metal, and gases introduced during the reacting do not include a metal, and
wherein gases introduced during the reacting comprise HF and $NH_3$.

17. The method according to claim 16, wherein:
the heat treatment is performed for 60 seconds or longer, and pressure is maintained in a range of 1000 mTorr to 5000 mTorr during the heat treatment;
in forming the first plasma, gases are supplied in a volumetric flow rate of 5% to 25% $NF_3$, 25% to 55% oxygen, and 25% or less hydrogen, and pressure is 10 mTorr to 1000 mTorr; and
during the heat treatment of 60 seconds or longer, HF and $NH_3$ are not supplied to an environment in which the substrate is positioned.

18. The method of claim 14, wherein the substrate includes a first region and a second region, in the first region a first device is provided which is covered by the layer and the layer is exposed prior to the modifying, and in the second region a second device is provided, the second device covered by the layer and the layer is covered by an organic layer,
wherein after the modifying, and after performing the gas chemistry etch including the reacting and the heat treatment, the layer in the first region is removed, the layer in the second region is not removed, and the organic layer in the second region remains covering the layer in the second region,
in forming the first plasma, an oxygen containing gas is supplied at a volumetric flow rate of 1% to 5% of a total gas flow, and a fluorine containing gas is supplied at a volumetric flow rate of 5% to 25% of the total gas flow, and
the heat treatment is performed at a temperature in a range from 70° C. to 150° C.

19. The method of claim 14, wherein:
the substrate includes a first set of a first plurality of features and a second set of a second plurality of features, the second set of the second plurality of features being covered by an organic layer, and the first set of the first plurality of features is not covered by the organic layer,
the layer is a liner formed over the first set of the first plurality of features and is removed by the modifying and gas chemistry etch, and
the method further including removing the organic layer after removing of the liner.

20. The method of claim 14, wherein:
the substrate includes plural adjacent layers which are adjacent to and covered by the layer prior to the modifying, and each of the plural adjacent layers has at least one of a lower oxygen content or a higher carbon content compared to the modified surface,
the plural adjacent layers include a stack of alternating first and second layers, each first layer having a higher Ge content compared to each second layer, and each second layer having a higher Si content compared to each first layer,
one of the first and second layers is indented with respect to another of the first and second layers such that an indentation is provided in the one of the first and second layers,
prior to the modifying, the layer fills the indentation and covers side surfaces of both the first and second layers, and
after the heat treatment, the material of the layer remains in the indentation to form a spacer with an outer surface dimension of the spacer recessed from an outer surface dimension of the another of the first and second layers, and an outer surface of said another of the first and second layers is exposed.

21. A substrate processing method comprising:
providing a substrate which includes a spacer layer formed of a spacer material;
performing an etch and surface modification step in which a surface of the spacer material is etched to remove a portion of the spacer material and a remaining surface of the spacer material is modified to provide a modified surface having an increased content of oxygen and fluorine compared to the spacer material before the etch and modification step, the etch and surface modification step including exposing the spacer material to a plasma which includes at least fluorine and oxygen; and
after the etch and surface modification step, performing a gas chemistry etch which is not in a plasma to remove the modified surface of the spacer material, wherein performing the gas chemistry etch includes
reacting the modified surface at a temperature from 0° C. to 85° C. to form a reacted modified surface, and
after the reacting of the modified surface at 0° C. to 85° C., raising temperature of the substrate to a range of 100° C. to 250° C. to perform a heat treatment to remove the reacted modified surface.

* * * * *